(12) United States Patent  
Wang et al.

(10) Patent No.: US 7,642,607 B2
(45) Date of Patent: Jan. 5, 2010

(54) MOS DEVICES WITH REDUCED RECESS ON SUBSTRATE SURFACE

(75) Inventors: Chih-Hao Wang, Hsin-Chu (TW); Ta-Wei Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 116 days.

(21) Appl. No.: 11/320,012

(22) Filed: Dec. 27, 2005

(65) Prior Publication Data

US 2007/0034906 A1 Feb. 15, 2007

Related U.S. Application Data

(60) Provisional application No. 60/707,084, filed on Aug. 10, 2005.

(51) Int. Cl.
*H01L 29/78* (2006.01)
(52) U.S. Cl. .................. 257/408; 257/369; 257/616; 257/E21.431; 257/E21.437; 257/E21.619; 257/E21.634; 257/E29.266; 257/E29.278
(58) Field of Classification Search .................. 257/408
See application file for complete search history.

(56) References Cited

U.S. PATENT DOCUMENTS

| | | | | |
|---|---|---|---|---|
| 6,797,556 | B2 * | 9/2004 | Murthy et al. | 438/231 |
| 6,885,084 | B2 | 4/2005 | Murthy et al. | |
| 2004/0248354 | A1 | 12/2004 | Chidambaram et al. | |
| 2004/0262683 | A1 | 12/2004 | Bohr et al. | |
| 2004/0262694 | A1 | 12/2004 | Chidambaram | |
| 2005/0139872 | A1 | 6/2005 | Chidambaram et al. | |

OTHER PUBLICATIONS

Zhang, D., et al., "Embedded SiGe S/D PMOS on Thin Body SOI Substrate with Drive Current Enhancement," 2005 Symposium on VLSI Technology Digest of Technical Papers, pp. 26-27.
Ueno, T., et al., "Dramatically Enhanced Performance of Recessed SiGe Source-Drain PMOS by In-Situ Etch and Regrowth Technique (InSERT)," 2005 Symposium on VLSI Technology Digest of Technical Papers, pp. 24-25.
Chidambaram, P. R., et al., "35% Drive Current Improvement from Recessed-SiGe Drain Extensions on 37 nm Gate Length PMOS," 2004 Symposium on VLSI Technology Digest of Technical Papers, Jul. 2004, pp. 48-49.
Bai, P., et al., "A 65nm Logic Technology Featuring 35nm Gate Lengths, Enhanced Channel Strain, 8 Cu Interconnect Layers, Low-k ILD and 0.57 µm² SRAM Cell," IEDM, 2004, pp. 657-660.
Thompson, S. E., et al., "A 90-nm Logic Technology Featuring Strained-Silicon," IEEE Transactions on Electron Devices, vol. 51, No. 11, Nov. 2004, pp. 1790-1797.

* cited by examiner

*Primary Examiner*—Kenneth A Parker
*Assistant Examiner*—Jose R Diaz
(74) *Attorney, Agent, or Firm*—Slater & Matsil, L.L.P.

(57) ABSTRACT

A MOS device having reduced recesses under a gate spacer and a method for forming the same are provided. The MOS device includes a gate structure overlying the substrate, a sidewall spacer on a sidewall of the gate structure, a recessed region having a recess depth of substantially less than about 30 Å underlying the sidewall spacer, and a silicon alloy region having at least a portion in the substrate and adjacent the recessed region. The silicon alloy region has a thickness of substantially greater than about 30 nm. A shallow recess region is achieved by protecting the substrate when a hard mask on the gate structure is removed. The MOS device is preferably a pMOS device.

12 Claims, 9 Drawing Sheets

MOS DEVICES WITH REDUCED RECESS ON SUBSTRATE SURFACE

This application claims priority to provisional patent application Ser. No. 60/707,084, filed on Aug. 10, 2005, entitled "Scalable High Performance MOSFETs with High Strain," which application is hereby incorporated herein by reference.

TECHNICAL FIELD

This invention relates generally to semiconductor devices, and more particularly to metal-oxide-semiconductor (MOS) devices, and even more particularly to the structure and fabrication methods of MOS devices having highly-stressed channel regions.

BACKGROUND

The scaling of VLSI circuits is a constant effort. With circuits become smaller and faster, improvement of device driving current becomes more important. Metal-oxide-semiconductor (MOS) transistor current is closely related to gate length, gate capacitance, and carrier mobility in the channel region. Shortening poly-gate length, increasing gate capacitance and increasing carrier mobility can improve the device currents of MOS devices. Gate length reduction is an ongoing effort in order to shrink circuit size. Increasing gate capacitance has also been achieved by efforts such as reducing the gate dielectric thickness, increasing the gate dielectric constant, and the like. In order to further improve device current, enhancing carrier mobility has also been explored.

Among efforts made to enhance carrier mobility, forming a stressed channel region is a known practice. Stress, sometimes referred to as strain, can enhance electron and hole mobility. The performance of a MOS device can be enhanced through a stressed-surface channel. This technique allows performance to be improved at a constant gate length, without adding complexity to circuit fabrication or design. Research has revealed that a tensile stress in the channel length direction can improve nMOS performance, and a compressive stress in the channel length direction can improve pMOS device performance.

Figure 1:
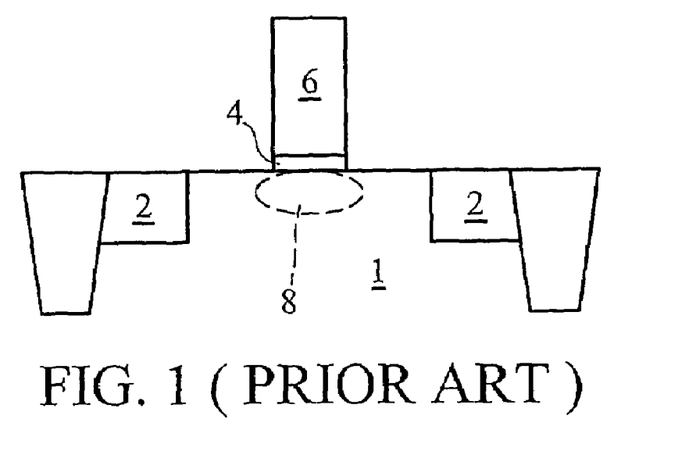
FIG. 1 illustrates a portion of a typical pMOS device comprising SiGe regions to apply a compressive stress to the channel region.

A commonly used structure for applying compressive stress to the channel region of a pMOS device is shown in FIG. 1. A gate stack including a gate dielectric 4 and a gate electrode 6 is formed on a silicon substrate 1. SiGe regions 2 are formed in the substrate 1 with a channel region 8 therebetween. Typically, the formation of the SiGe regions 2 includes forming recesses in the silicon substrate 1 and epitaxially growing SiGe (with desired impurities) in the recesses. Since SiGe has a greater lattice constant then silicon, SiGe regions 2 press on the channel region 8, so that a compressive stress is developed in the channel region 8.

Figure 2:
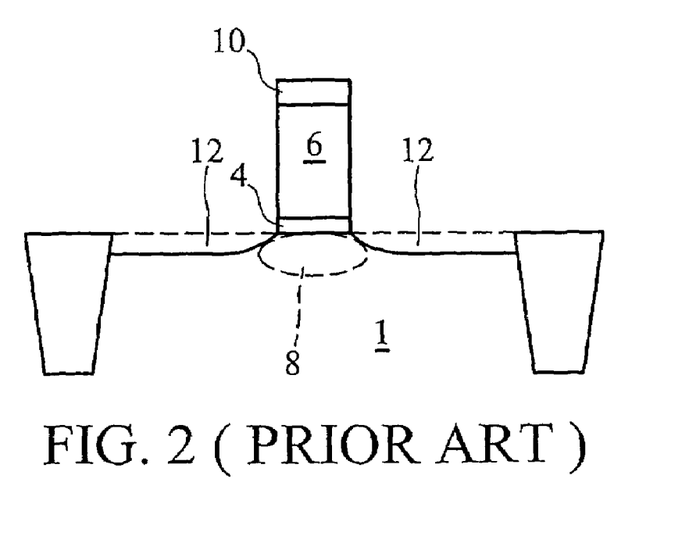
FIGS. 2 and 3 are cross-sectional views of intermediate stages in the fabrication of the gate structure of a pMOS device.
Figure 3:
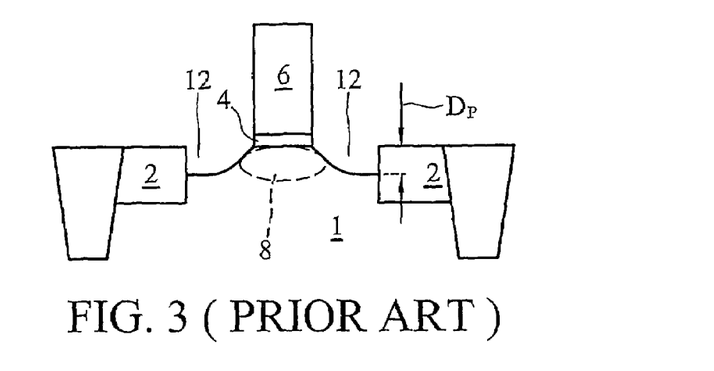

FIGS. 2 and 3 illustrate intermediate stages in the fabrication of the gate stack shown in FIG. 1. Typically, to form the gate stack, stacked layers, which include a gate dielectric layer, a gate electrode layer and a hard mask layer, are formed on the substrate 1. The stacked layers are then patterned to form gate dielectric 4, gate electrode 6, and hard mask 10. Hard masks have been extensively used in the formation of pMOS devices having SiGe regions. The patterning step may cause recesses 12 to be formed on the surface of the silicon substrate 1. In subsequent steps, as shown in FIG. 3, SiGe regions 2 are formed and the hard mask 10 is removed. Typically, the hard mask 10 comprises silicon nitride and is preferably removed using $H_3PO_4$. $H_3PO_4$ attacks silicon substrate 1 and results in deepened recesses 12. In prior art pMOS devices, if the hard mask is removed by $H_3PO_4$ after epitaxially growing SiGe regions 2, the depth $D_p$ of the recesses 12 is easily greater than about 30 Å, and even achieving a depth of only 30 Å is difficult.

When doped SiGe regions are formed in pMOS devices, the impurities in the SiGe are more prone to diffusion during subsequent thermal processes. Diffused impurities deepen junction depths and compensate for pocket regions, resulting in the reduction of junction abruptness. Therefore, the short channel effects are adversely affected. If deeper recesses are formed under the spacers, the junction depth will be further increased, and the performance of the pMOS devices will be affected more.

Therefore, there is the need for a method for forming MOS devices, particularly pMOS devices, with reduced recesses in substrate regions close to the gate structure.

SUMMARY OF THE INVENTION

The preferred embodiment of the present invention provides a MOS device having reduced recesses under the gate spacer and a method for forming the same.

In accordance with one aspect of the present invention, the MOS device includes a gate structure overlying a substrate, a sidewall spacer on a sidewall of the gate structure, a recessed region in the substrate having a recess depth of substantially less than about 30 Å underlying the sidewall spacer, and a silicon alloy region having at least a portion in the substrate and adjacent the recessed region. The silicon alloy region has a thickness of substantially greater than about 30 nm. With appropriate etchant and a carefully controlled etching process for forming the gate structure, the depth of the recess is preferably substantially less than about 10 Å.

In accordance with another aspect of the present invention, the MOS device is a pMOS device. The substrate is preferably a silicon substrate, and the silicon alloy region preferably comprises SiGe. The sidewall spacer preferably extends over a portion of the silicon alloy region.

In accordance with yet another aspect of the present invention, the method for forming the MOS device includes forming a gate structure overlying a substrate, forming a hard mask overlying the gate structure, forming a first sidewall spacer on a sidewall of the gate structure, forming a silicon alloy region spaced apart from the gate structure in the substrate, and removing the hard mask. At least one portion of the first sidewall spacer protects a surface region of the substrate close to the gate structure during the step of removing the hard mask.

In accordance with yet another aspect of the present invention, the method for forming the MOS device further includes implanting a doped region in the substrate after the step of forming the first sidewall spacer, and forming a second sidewall spacer on a sidewall of the first sidewall spacer before the step of forming the silicon alloy region. The doped region bridges a space between the silicon alloy region and a lightly doped drain/source region.

In accordance with yet another aspect of the present invention, the method for forming the MOS device further includes simultaneously removing an upper portion of the second sidewall spacer when the hard mask is removed, removing a lower portion of the second sidewall spacer, and simultaneously removing an upper portion of the first sidewall spacer when a hard mask on an additional gate structure of an additional MOS device is removed. Preferably, the hard mask and the upper portions of the first and second sidewall spacers are formed of similar materials. More preferably, they are formed of silicon nitride.

With the depth of the recesses in the substrate reduced, the junction depth of the MOS device is reduced, resulting in improved short channel effects and higher device drive currents.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention are illustrated in FIGS. 4 through 16. Throughout the various views and illustrative embodiments of the present invention, like reference numbers are used to designate like elements.

Figure 4:
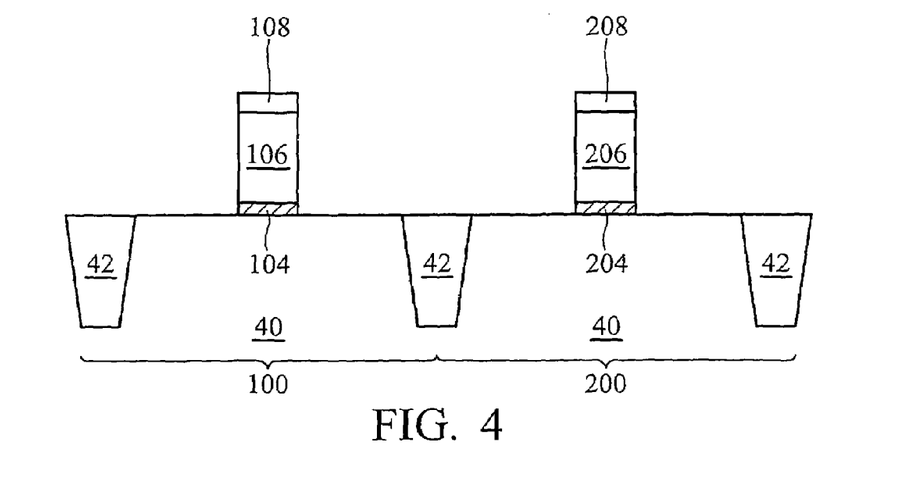
FIGS. 4 through 16 are cross-sectional views of intermediate stages in the fabrication of a preferred embodiment of the present invention.

FIG. 4 illustrates two gate stacks formed on a substrate 40, which comprises two regions, a region 100 for forming a pMOS device and a region 200 for forming an nMOS device. The regions 100 and 200 are isolated by shallow trench isolations 42. The gate stack in the pMOS region 100 includes a gate dielectric 104 and a gate electrode 106, and the gate stack in the nMOS region 200 includes a gate dielectric 204 and a gate electrode 206.

Substrate 40 preferably comprises bulk silicon, but other commonly used materials and structures such as silicon on insulator (SOI) can also be used. An n-well region and a p-well region (not shown) are preferably formed in the regions 100 and 200, respectively. The gate dielectrics 104 and 204 are preferably formed of high-k materials with a k value greater than about 3.9. The preferred materials include tantalum, lanthanum, hafnium, aluminum, $HfO_x$, $HfSiO_x$, $HfSiO_xN_y$, $AlO_x$, $LaO_x$, $HfAlO_x$, $ZrO_2$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{1-x}Sr_x$-$TiO_3$, $PbTiO_3$, $BaTiO_3$, $SrTiO_3$, $PbZrO_3$, PST, PZN, PZT, PMN, and combinations thereof. The gate electrodes 106 and 206 preferably comprise metal nitrides such as TiN and TaN, metals such as Mo and Ti, and metal silicides such as $MoSi_x$ and $TaSi_xN_y$, and the like. The gate stacks are masked by hard masks 108 and 208, respectively. In the preferred embodiment, hard masks 108 and 208 are formed of silicon nitride. In alternative embodiments, they are formed of silicon oxynitride, oxide, and the like.

Figure 5:
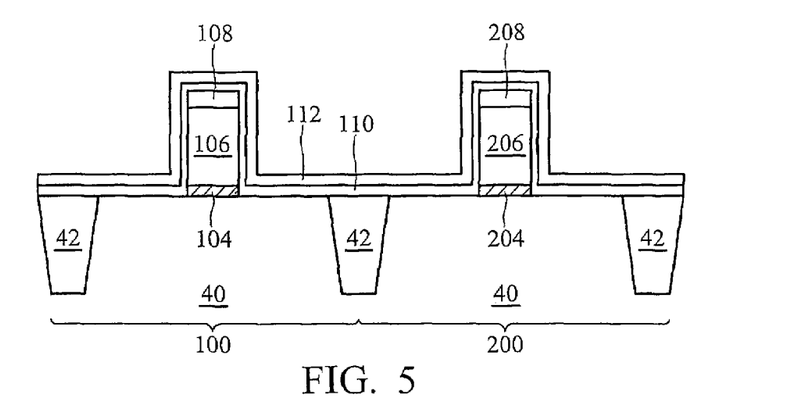

FIG. 5 illustrates the formation of a first spacer layer formed over pMOS region 100 and nMOS region 200. In the preferred embodiment, the first spacer layer is a composite layer comprising a lower sub layer 110 and an upper sub layer 112, which preferably have different etching characteristics. More preferably, the lower sub layer 110 is formed of oxides, thus is interchangeably referred to as a liner oxide layer 110, and the upper sub layer 112 is formed of silicon nitride, thus is referred to as a nitride layer 112. In other embodiments, the first spacer layer may have a single or a composite layer comprising oxide, silicon nitride, silicon oxynitride (SiON) and/or other dielectric materials. The first spacer layer may be formed using commonly used techniques, such as plasma enhanced chemical vapor deposition (PECVD), low-pressure chemical vapor deposition (LPCVD), sub-atmospheric chemical vapor deposition (SACVD), etc.

Figure 6:
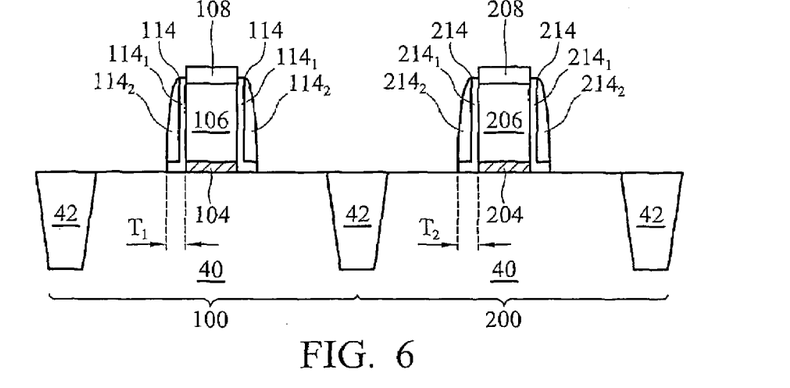

FIG. 6 illustrates the liner oxide layer 110 and nitride layer 112 patterned to form first spacers 114 and 214 in regions 100 and 200, respectively. Either wet etching or dry etching may be used for the patterning. The resulting first spacers 114 and 214 each include a liner oxide portion (also referred to as an inner portion) and a nitride portion (also referred to as an outer portion), namely $114_1$, $114_2$ and $214_1$, and $214_2$, respectively. Preferably, the thicknesses $T_1$, and $T_2$ of the respective first spacers 114 and 214 are greater than about 100 Å, and more preferably between about 120 Å and about 300 Å.

Figure 7:
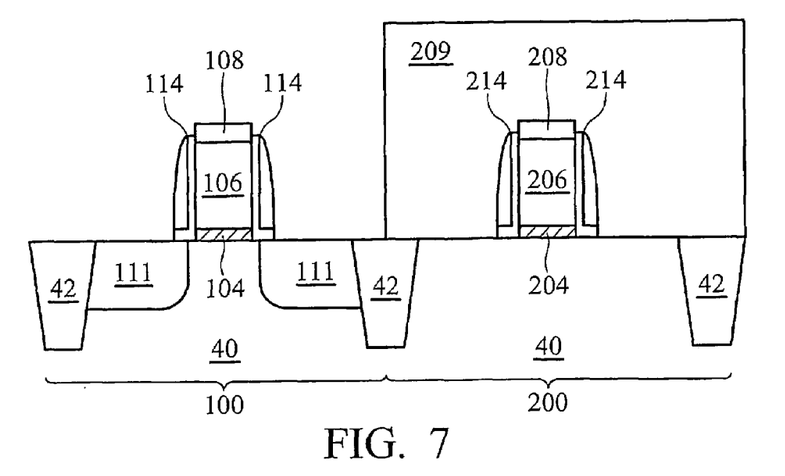

Referring to FIG. 7, a photo resist 209 is formed to mask region 200. An implant is performed on region 100, forming doped regions 111, which preferably comprise p-type impurities such as boron and $BF_2$. Doped regions 111 will bridge potential gaps between subsequently formed silicon alloy regions and the gate electrode 106.

Figure 8:
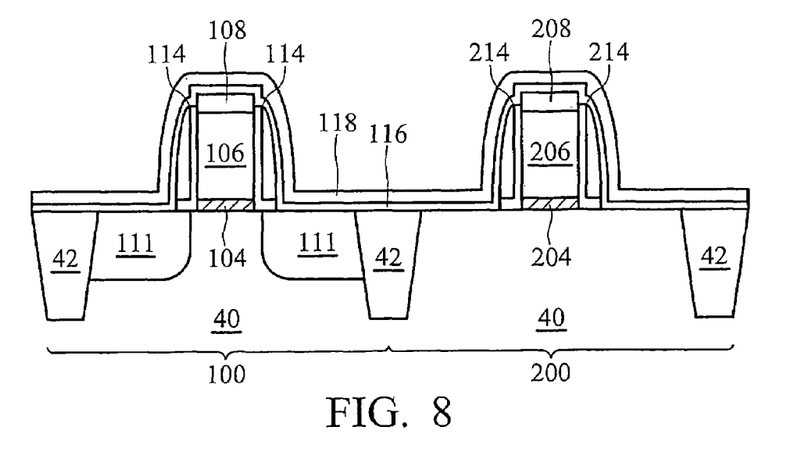

FIG. 8 illustrates the formation of a second spacer layer comprising sub layers 116 and 118, which preferably have different etching characteristics. The second spacer sub layers 116 and 118 preferably comprise similar materials as the first spacer sub layers 110 and 112, respectively. Additionally, sub layer 118 preferably comprises similar materials as the hard masks 108 and 208.

Figure 9:
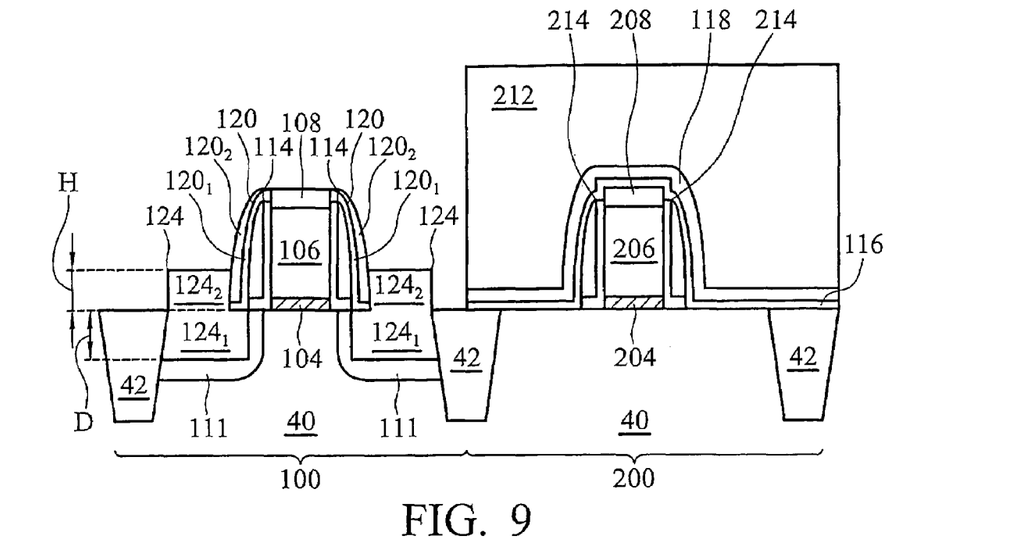

Referring to FIG. 9, a photo resist 212 is formed covering nMOS region 200. Second spacer sub layers 116 and 118 in region 100 are then patterned, forming second spacers 120. Each spacer 120 comprises an inner portion $120_1$, and an outer portion $120_2$.

Silicon alloy regions 124 are then formed in region 100. The silicon alloy regions 124 preferably have a substantially greater lattice constant than the substrate 40. Preferably, the silicon alloy regions 124 are formed by etching substrate 40 isotropically to form recesses, and epitaxially growing a silicon alloy in the recesses.

The silicon alloy regions 124 preferably extend under the second spacers 120, and more preferably reach the interface of the respective spacers 114 and 120. In order to strengthen the compressive stress applied by the silicon alloy regions 124, the silicon alloy regions 124 preferably outgrow the top surface of the substrate 40, forming raised portions $124_2$. The raised portions $124_2$ preferably have a height H of less than the height of the gate electrode 106, and more preferably between about 100 Å and about 700 Å. However, the top surface of silicon alloy regions 124 can be substantially leveled with or lower than the top surface of the substrate 40. The depth D of the silicon alloy regions 124, which is also the depth of the portions $124_1$ in the substrate 40, is preferably greater than about 300 Å, and more preferably greater than about 350 Å, and even more preferably between about 400 Å and 900 Å.

In the preferred embodiment, the substrate 40 is formed of silicon, and the silicon alloy regions 124 are formed of SiGe. Germanium atoms have a greater size than silicon atoms, and the lattice constant of SiGe is greater than that of the silicon substrate. The lattice constant of SiGe can be adjusted by adjusting the percentage of germanium in the SiGe, and the stress applied by the SiGe regions 124 changes accordingly. In other embodiments, the silicon alloy region comprises silicon germanium and other elements such as carbon.

Figure 10:
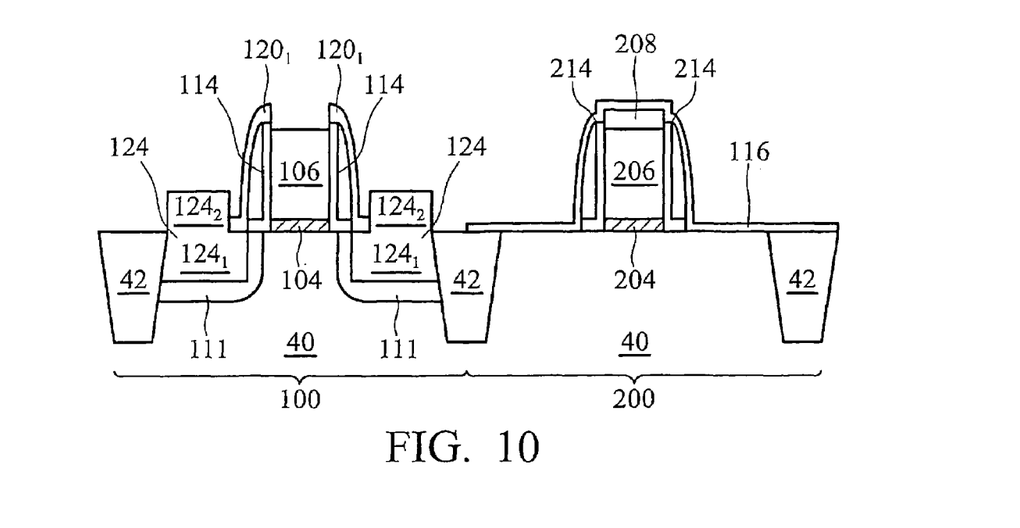

In FIG. 10, photo resist 212 is removed. An etchant that attacks the hard mask 108 but not the inner spacer portions $120_1$, and the second spacer sub layer 116 is used to remove the hard mask 108. Outer spacer portions $120_2$ and the second spacer sub layer 118 are also removed, preferably simultaneously. In the preferred embodiment, hard mask 108, spacer portions $120_2$ and layer 118 are formed of silicon nitride, thus are preferably removed using $H_3PO_4$. Note that the surface of the substrate 40 is protected by the spacer portions $120_1$ and layer portion 114.

Figure 11:
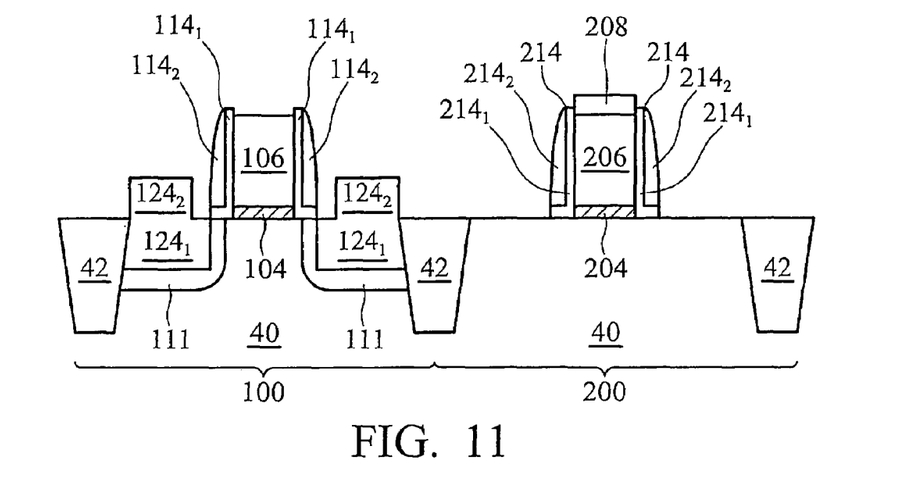

Referring to FIG. 11, spacer $120_1$ and layer 116 are removed by using an etchant that does not attack the spacer portions $114_2$ and $214_2$. In the preferred embodiment wherein the spacer (layer) $120_1$ and 116 are formed of oxides, HF is used.

Figure 12:
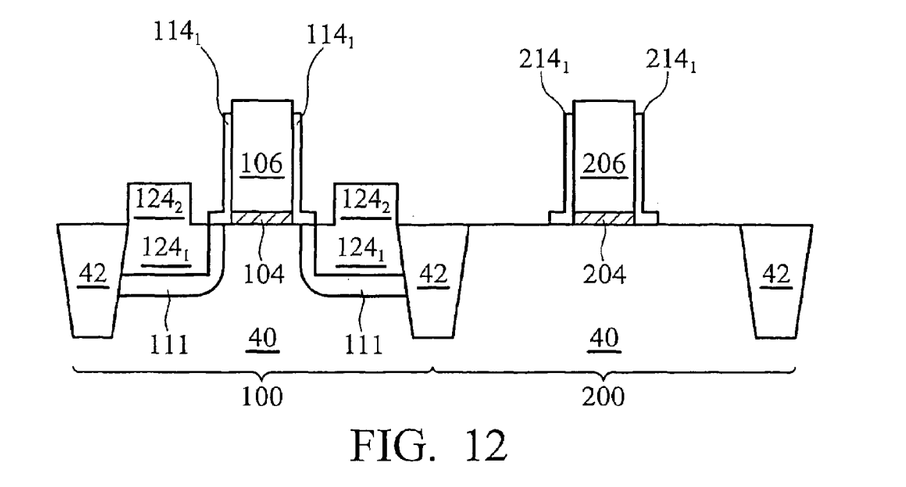

FIG. 12 illustrates the removal of the spacer portions $114_2$ and $214_2$ and hard mask 208, preferably using a similar etchant as used for removing the spacer portions $120_2$. In pMOS region 100, since the top surface of the silicon substrate 40 is protected by spacer portions $114_1$, no recesses are formed. Silicon alloy regions 124 are not sensitive to the etchant ($H_3PO_4$), thus recess formation is minimal. In nMOS region 200, recesses may be formed in the regions not protected by the spacer portions $214_1$. However, recesses formed in these regions do not have significant effects on the device performance. The same is true for any recess formed in silicon alloy regions 124.

Figure 13:
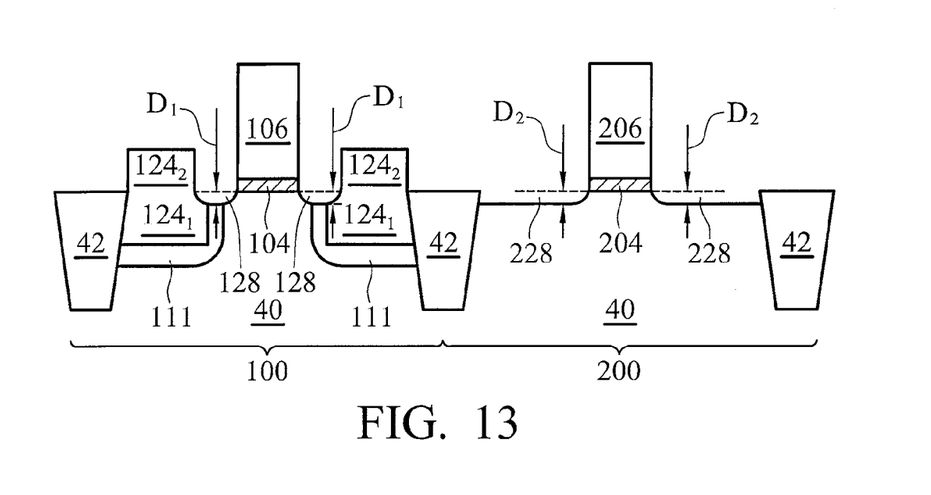

The remaining portions $114_1$ and $214_1$ of the first spacers are then removed, preferably using HF, as shown in FIG. 13. The preferred etchant, such as HF, has a much lower etching rate for etching silicon. Additionally, in regions close to the gate electrode 106 and 206, only over-etching attacks the surface of substrate 40. Therefore, the resulting recesses, if there are any, are much shallower than in prior art structures. For illustration purposes, recesses 128 and 228 are shown. The depth $D_1$ of the recesses 128 and depth $D_2$ of the recesses 228 can easily be less than about 30 Å, and more preferably can (easily) be less than about 10 Å with use of a suitable etchant and a carefully controlled etching process.

Shallower recesses in regions close to the gate electrode 106, particularly in the regions between the channel region of the resulting pMOS device and the silicon alloy regions 124, reduce the junction depth and improve the short channel effects. The performance of the pMOS devices is thus improved.

Figure 14:
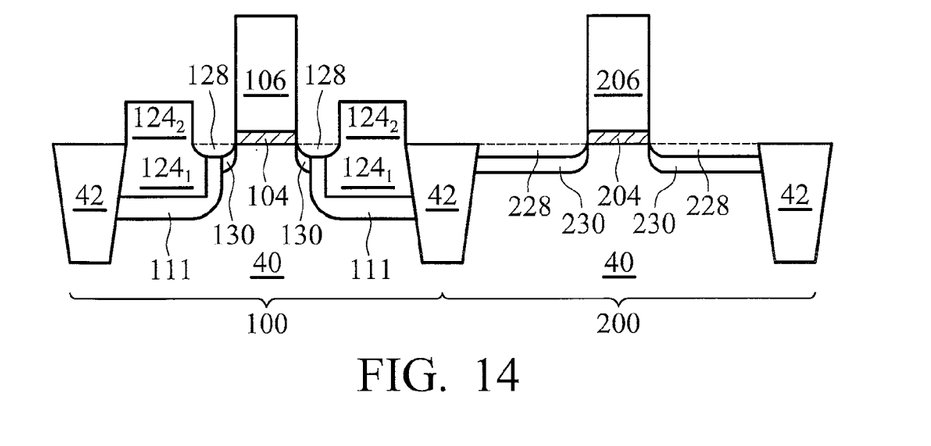

FIG. 14 illustrates the formation of lightly doped drains (LDD) 130 and LDD regions 230 in regions 100 and 200, preferably by implants introducing n-type and p-type impurities, respectively. LDD regions 230 are substantially aligned with the edges of the gate electrode 206. When the LDD regions 230 are implanted with n-type impurities, a photo resist (not shown) is formed over and masks the pMOS region 100. Similarly, the pMOS region 100 is doped with p-type impurities while the nMOS region 200 is masked, forming LDD regions 130. Note that doped regions 111 bridge the LDD regions 130 and silicon alloy regions 124.

Figure 15:
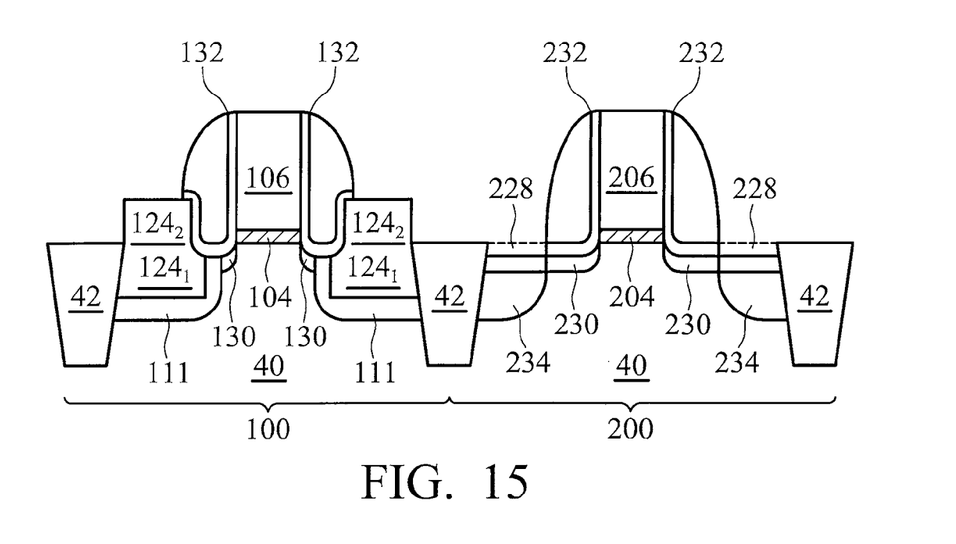

FIG. 15 illustrates the formation of spacers 132, 232 and source/drain regions 234. The spacers 132 and 232 are preferably formed using the method discussed in previous paragraphs. The source/drain regions 234 are then formed in region 200. The formation details are known in the art, thus are not repeated herein. Note that the source/drain regions for the pMOS device, which comprise regions 111 and doped silicon alloy regions 124, have already been formed.

Figure 16:
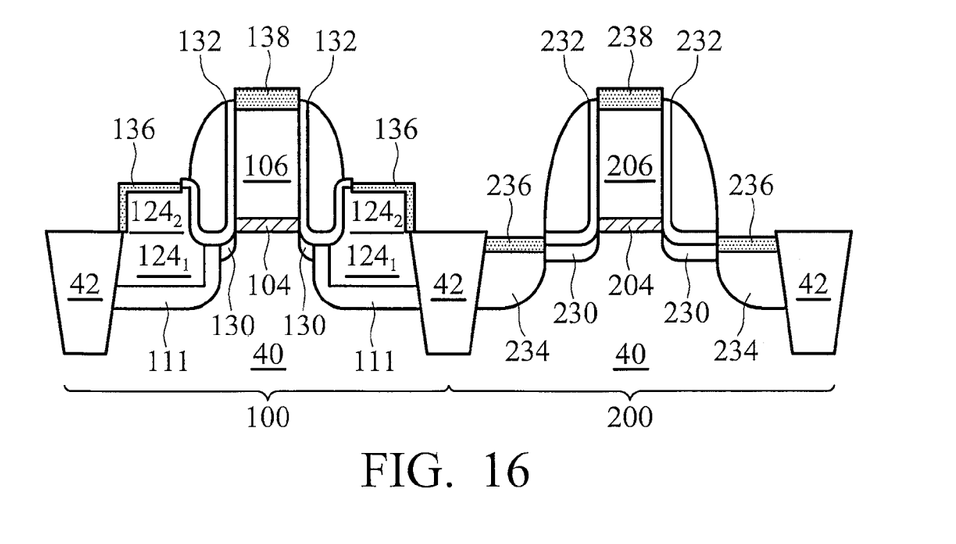

Referring to FIG. 16, a salicide process is performed to form silicide regions 136, 138 and 236, 238. As is known in the art, a salicide process is preferably performed by blanket deposition of an appropriate metal layer, such as titanium, cobalt, nickel, palladium, platinum, erbium, and the like, followed by an annealing step in which the metal reacts with underlying exposed silicon. Un-reacted metal is then removed, preferably with a selective etch process. It is noted that silicide regions 136 comprise a portion substantially higher than the silicide region 236.

Figure 17:
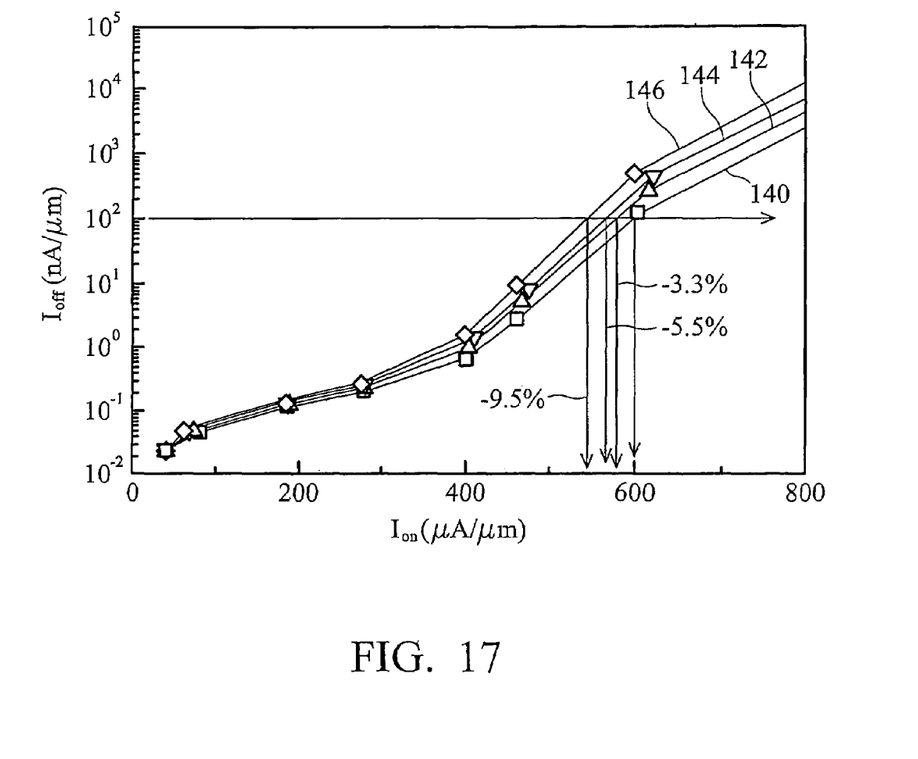
FIG. 17 illustrates simulation results of pMOS devices having different recess depths.

The preferred embodiments of the present invention significantly improve the drive currents of pMOS devices. FIG. 17 illustrates simulation results of pMOS devices having no recess, 25 Å deep recesses, 50 Å deep recesses, and 100 Å deep recesses, wherein leakage currents $I_{off}$ of the pMOS devices are illustrated as functions of drive currents $I_{on}$. It is found that at the same leakage current, for example, 100 n Å/μm, the drive current of pMOS devices with 25 Å recesses (line 142) is degraded by about 3.3 percent compared to pMOS devices having no recess (line 140). Drive current degradations of 5.5 percent and 9.5 percent are observed on pMOS devices having 50 Å recesses (line 144) and 100 Å recesses (line 146), respectively.

The preferred embodiments of the present invention are fully compatible with existing MOS device fabrication processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate;
   a gate structure overlying the substrate, the gate structure comprising a gate dielectric over the substrate and a gate electrode over the gate dielectric;
   a lightly doped drain/source (LDD) region substantially aligned with an edge of the gate structure;
   a sidewall spacer on a sidewall of the gate structure;
   a doped source/drain region formed into the substrate spaced apart from the sidewall spacer having a depth into the substrate substantially greater than about 30 nanometers;
   a recessed region having a recess depth of substantially less than about 30 Å in the substrate, wherein at least a portion of the recessed region is under the sidewall spacer; and
   a silicon alloy region extending into and contained by the doped source/drain region and adjacent the recessed region, wherein the silicon alloy region has a substantially greater lattice constant than the substrate, and a thickness of substantially greater than about 30 nm;
wherein the silicon alloy region is spaced apart from the LDD region by a portion of the doped source/drain region.

2. The semiconductor device of claim 1, wherein the gate spacer covers a portion of the silicon alloy region.

3. The semiconductor device of claim 1, wherein the gate dielectric has a k value of greater than about 3.9.

4. The semiconductor device of claim 1, wherein the gate electrode comprises a metal silicide.

5. The semiconductor device of claim 1, wherein the silicon alloy region comprises a p-type impurity.

6. The semiconductor device of claim 1, wherein the silicon alloy region comprises SiGe.

7. The semiconductor device of claim 1, wherein the silicon alloy region comprises a portion above a top surface of the substrate.

8. A semiconductor structure comprising:
   a substrate;
   a first gate structure of a first transistor overlying the substrate, the first transistor being of a first conductivity type, the first gate structure comprising a gate dielectric overlying the substrate and a gate electrode overlying the gate dielectric;
   a lightly doped source/drain (LDD) region substantially aligned with an edge of the gate structure;
   a first gate spacer on a sidewall of the first gate structure;
   a first recessed region of the substrate having a first recess depth of substantially less than about 30 Å, wherein the first recessed region has a top surface adjoining a bottom surface of the first gate spacer;
   a first source/drain doped region in the substrate spaced from the sidewall of the first gate structure, the first source/drain region comprising and entirely containing a silicon alloy region having a substantially greater lattice constant than the substrate, wherein the silicon alloy region is spaced apart from the LDD region by a portion of the first source/drain doped region;
   a second gate structure of a second transistor overlying the substrate, the second transistor being of a second conductivity type opposite the first conductivity type;
   a second source/drain doped region in the substrate and formed in alignment to a sidewall of the second gate structure;
   a second gate spacer on a sidewall of the second gate structure; and
   a second recessed region comprising at least a portion of the second source/drain doped region, wherein a portion of the second recessed region has a second recess depth of substantially less than about 30 Å, and wherein the portion of the second recessed region has a top surface adjoining a bottom surface of the second gate spacer.

9. The semiconductor structure of claim 8, wherein the first conductivity type is p-type and the second conductivity type is n-type.

10. The semiconductor structure of claim 8, wherein the silicon alloy region comprises a portion substantially higher than a top surface of the substrate.

11. The semiconductor structure of claim 8, wherein the silicon alloy region comprises SiGe.

12. The semiconductor structure of claim 8, wherein the first source/drain doped region is of p-type, and the second source/drain doped region is of n-type, and wherein the first recessed region has a width of between about 100 Å and about 300 Å, and wherein the second recessed region has a width of greater than about 300 Å.

* * * * *